(12) United States Patent
Chuang et al.

(10) Patent No.: US 9,490,147 B2
(45) Date of Patent: Nov. 8, 2016

(54) STUD BUMP STRUCTURE AND METHOD FOR MANUFACTURING THE SAME

(71) Applicant: Wire Technology Co., LTD., Taichung (TW)

(72) Inventors: Tung-Han Chuang, Taipei (TW); Hsing-Hua Tsai, Taichung (TW); Jun-Der Lee, Taichung (TW)

(73) Assignee: Wire Technology Co., Ltd., Taichung (TW)

( * ) Notice: Subject to any disclaimer, the term of this patent is extended or adjusted under 35 U.S.C. 154(b) by 86 days.

(21) Appl. No.: 13/762,132

(22) Filed: Feb. 7, 2013

(65) Prior Publication Data

US 2014/0124920 A1 May 8, 2014

(30) Foreign Application Priority Data

Nov. 7, 2012 (TW) .............................. 101141253 A

(51) Int. Cl.
*H01L 23/48* (2006.01)
*H01L 23/52* (2006.01)
*H01L 29/40* (2006.01)
(Continued)

(52) U.S. Cl.
CPC ..... *H01L 21/4853* (2013.01); *H01L 23/49811* (2013.01); *H01L 24/11* (2013.01); *H01L 24/13* (2013.01); *H01L 24/16* (2013.01); *H01L 2224/0401* (2013.01); *H01L 2224/05624* (2013.01); *H01L 2224/05644* (2013.01); *H01L 2224/05647* (2013.01); *H01L 2224/05655* (2013.01); *H01L 2224/1134* (2013.01); *H01L 2224/11901* (2013.01); *H01L 2224/131* (2013.01); *H01L 2224/133* (2013.01); *H01L 2224/1329* (2013.01); *H01L 2224/13082* (2013.01); *H01L 2224/13139* (2013.01); *H01L 2224/1601* (2013.01); *H01L 2224/16058* (2013.01); *H01L 2224/16238* (2013.01);

(Continued)

(58) Field of Classification Search
CPC .......... H01L 2924/01079; H01L 2924/01029; H01L 2924/01013; H01L 21/76886; H01L 21/76885; H01L 21/4853; H01L 2224/1134; H01L 2224/131; H01L 2224/13139; H01L 2924/014; H01L 24/11–24/13; H01L 24/16; H01L 2224/0401
USPC ......... 257/E23.069, E23.021, 673, 737, 738, 257/772, 779–781; 438/123, 612–614
See application file for complete search history.

(56) References Cited

U.S. PATENT DOCUMENTS 5,550,407 A 8/1996 Ogashiwa
5,949,654 A 9/1999 Fukuoka
(Continued)

FOREIGN PATENT DOCUMENTS

JP 2007-142271 6/2007
JP 2010-034527 A 2/2010
(Continued)

OTHER PUBLICATIONS

Korean Patent Office, Office Action, Patent Application Serial No. 10-2013-92982, Sep. 1, 2014, Korea.

*Primary Examiner* — Jose R Diaz

(57) ABSTRACT

A stud bump structure and method for manufacturing the same are provided. The stud bump structure includes a substrate, and a first silver alloy stud bump disposed on the substrate, wherein the first silver alloy stud bump has a weight percentage ratio of Ag:Au:Pd=60-99.98:0.01-30: 0.01-10.

13 Claims, 8 Drawing Sheets

(51) Int. Cl.
*H01L 21/48* (2006.01)
*H01L 23/498* (2006.01)
*H01L 23/00* (2006.01)

(52) U.S. Cl.
CPC .. *H01L2224/81193* (2013.01); *H01L 2224/94* (2013.01); *H01L 2924/12041* (2013.01)

(56) References Cited

U.S. PATENT DOCUMENTS

2002/0149118 A1* 10/2002 Yamaguchi et al. .......... 257/778
2007/0114663 A1* 5/2007 Brown et al. ................. 257/737
2007/0222085 A1 9/2007 Abe et al.
2010/0126763 A1 5/2010 Matsumura et al.

FOREIGN PATENT DOCUMENTS

TW I237857 8/2005
TW I284973 8/2007

* cited by examiner

STUD BUMP STRUCTURE AND METHOD FOR MANUFACTURING THE SAME

CROSS REFERENCE TO RELATED APPLICATIONS

This Application claims priority of Taiwan Patent Application No. 101141253, filed on Nov. 7, 2012, the entirety of which is incorporated by reference herein.

BACKGROUND OF THE DISCLOSURE

1. Field of the Invention

The present invention relates to a stud bump structure and a method for manufacturing the same, and in particular, relates to a silver alloy stud bump structure and a method for manufacturing the same.

2. Description of the Related Art

Interconnection methods for integrated circuit chips include wire bonding, tape automated bonding, flip chip bonding, or the like. In a tape automated bonding device or a flip chip bonding devices, a conductive stud bump is used as a connection point between a chip and a substrate. These techniques are all high density packaging techniques.

Advantages of flip chip bonding may include having great amounts of connection points, small distances between each connection point, small package areas, good performance at a high frequency, high reliability, and good resistance to electromagnetic interference. Therefore, flip chip bonding has been commonly used in packaging processes for an electric device such as an integrated circuit (IC) or a light emitting diode (LED).

Manufacturing and packaging a bump play an important role in a flip chip bonding process. Most of the flip chip bumps are made of solder alloys, such as Sn-37Pb, Sn-9Zn, Sn-0.7Cu, Sn-3.5Ag, Sn-51In, Sn-58Bi, Sn-3-Ag-0.5Cu, Sn-9Zn-3Bi, or the like.

Methods for manufacturing a solder bump may include electroplating and stencil printing. However, a solder bump manufactured by electroplating is usually harmful for the environment and its specific alloy composition is usually difficult to control. In addition, it is also difficult to find an appropriate plating solution and plating process to form a Pb-free solder bump therein. For example, if a bump is formed of an alloy such as Sn-3.5Ag, Sn-0.7Cu, or Ag-0.5Cu, the composition of the alloy is usually hard to control. If a bump is formed of an alloy such as Sn-51In, Sn-58Bi, or Sn-9Zn—Bi, it is usually very difficult to find an appropriate plating solution.

Therefore, nowadays, stencil printing of a solder paste has become an essential method in a flip chip packaging process. A key material for a flip chip solder paste is tin powders. Generally, a particle size of a tin powder in a surface mount technology (SMT) is between about 30 µm and 50 µm, wherein the tin powder of this size is easier to be manufactured. However, since a size of a flip chip bump is usually smaller than 120 µm, the size of the tin powder is required to be smaller than 10 µm and the tin powder with this small size is very difficult to be manufactured. In addition, when the size of the flip chip bump is decreased to be smaller than 100 µm, or even about 50 µm, each bump may only contain a few tin powders even if the size of the tin powder is smaller than 10 µm. Therefore, the difficulty of coplanarity tends to occur after a reflow process. Other problems of manufacturing a flip chip bump by solder paste include holes being formed by flux after a reflow process and manufacturing failures of the stencil printing may increase when a distance between each connection point is less than 100 µm.

In electronic packaging industry, electroplating gold and copper bumps are also used for flip chip assembly. However, the electroplating process for gold and copper bumps has also concern of environmental pollution. In addition, the intermetallic compounds grow rapidly at the interface between gold bump and aluminum pad, which are often accompanied with the occurrence of Kirkendall voids. Both the effects of intermetallic compounds and Kirkendall voids can cause the embrittlement and electrical resistance increase of connection point. In contrast, the intermetallic compounds formed at the copper bump/aluminum pad interface are very thin, leading to an insufficient bonding. An alternative bumping method, using gold or copper wires to produce gold or copper stud bumps, has similar disadvantages of excessive intermetallics growth for gold stud bump and insufficient intermetallics formation for copper stud bump. The rigidity of copper stud bump can additionally cause the cracking of under-pad chip.

Tape automated bonding (TAB) is another technique used in a high density packaging process. Advantages of the TAB package may include having a great amount of connection points, high strength of connection points, and good electrical and thermal conductivity. In addition, the tape automated bonding may be performed automatically and can be tested during packing process. Furthermore, the thickness of a resulting package may be minimized. In a TAB process, gold and copper bumps are conventionally employed, which are also manufactured by electroplating or stud bumping method as in a flip chip process. However, either electroplating gold bump or gold stud bump is expensive due to the material cost and the problems of excessive intermetallic compounds and Kirkendall voids similarly occur in a TAB process as in a flip chip assembly. On the other hand, either electroplating copper bump or copper stud bump in TAB package has the disadvantages of insufficient intermetallics growth and severe oxidation. The failure of under-pad chip cracking due to the rigidity of copper can also be caused during the copper stud bumping process.

BRIEF SUMMARY OF THE DISCLOSURE

An embodiment of the disclosure provides a stud bump structure, including: a substrate; and a first silver alloy stud bump disposed on the substrate, wherein the first silver alloy stud bump has a weight percentage ratio of Ag:Au:Pd=60-99.98:0.01-30:0.01-10.

Another embodiment of the disclosure provides a method for manufacturing a stud bump structure, including: providing a silver alloy wire; melting an end of the silver alloy wire to form a first free air ball (FAB); bonding the first free air ball onto a substrate to form a first ball bond; and cutting off the silver alloy wire, such that the first ball bond is left on the substrate to form a first silver alloy stud bump, wherein the first silver alloy stud bump has a weight percentage ratio of Ag:Au:Pd=60-99.98:0.01-30:0.01-10.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE DISCLOSURE

The following description is of the best-contemplated mode of carrying out the invention. This description is made for the purpose of illustrating the general principles of the invention and should not be taken in a limiting sense. The scope of the invention is best determined by reference to the appended claims.

Moreover, the formation of a first feature over and on a second feature in the description that follows may include embodiments in which the first and second features are formed in direct contact, and may also include embodiments in which additional features may be formed between the first and second features, such that the first and second features may not be in direct contact.

Figure 1:
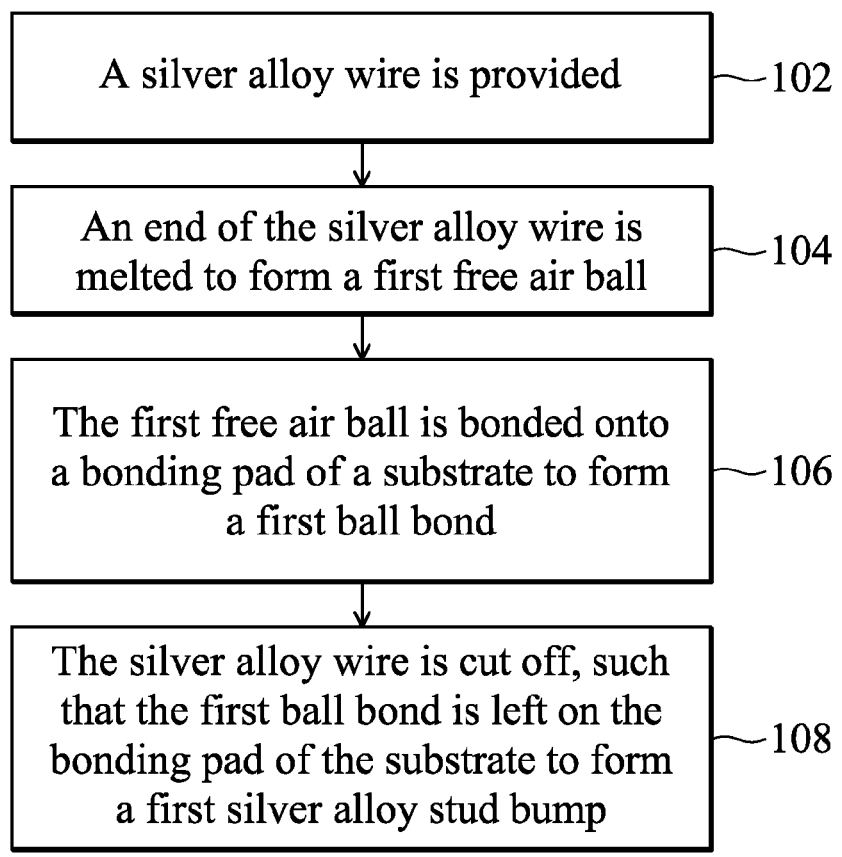
FIG. 1 illustrates a flow chart of manufacturing a stud bump structure according to one embodiment.

FIG. 1 illustrates a flow chart of manufacturing a stud bump structure. In step 102, a silver alloy wire is provided. In step 104, an end of the silver alloy wire is melted to form a first free air ball (FAB). In step 106, the first free air ball is bonded onto a substrate to form a first ball bond. In step 108, the silver alloy wire is cut off, such that the first ball bond is left on the substrate to form a first silver alloy stud bump.

Figure 2:
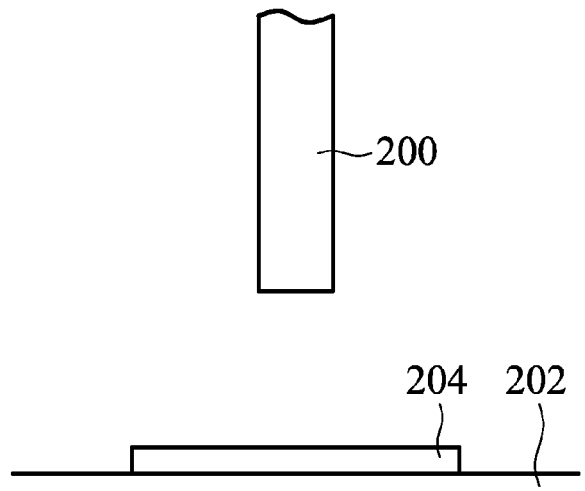
FIGS. 2 to 5 illustrate diagrams of manufacturing a stud bump structure according to one embodiment.

FIGS. 2 to 5 illustrate diagrams of manufacturing a stud bump structure. Referring to FIGS. 1 and 2, a silver alloy wire 200 is provided in step 102. In addition, a substrate 202 and a bonding pad 204 may also be provided. The silver alloy wire 200 is pulled above the bonding pad 204 on the substrate 202. According to this embodiment, the silver alloy wire 200 has a weight percentage ratio of Ag:Au:Pd=60-99.98:0.01-30:0.01-10, wherein silver is the main element in the silver alloy wire 200 (for example, containing more than 50 wt % of silver). A wire diameter of the silver alloy wire may be between 10 μm and 50 μm, but the silver alloy wire having various diameters may also be used in various applications. The substrate 202 may be a chip or a wafer. Examples for the bonding pad 204 may include, but are not limited to, an Al pad, a Ni pad, a Cu pad, a Au pad, or other appropriate surface finished pads.

Figure 3:
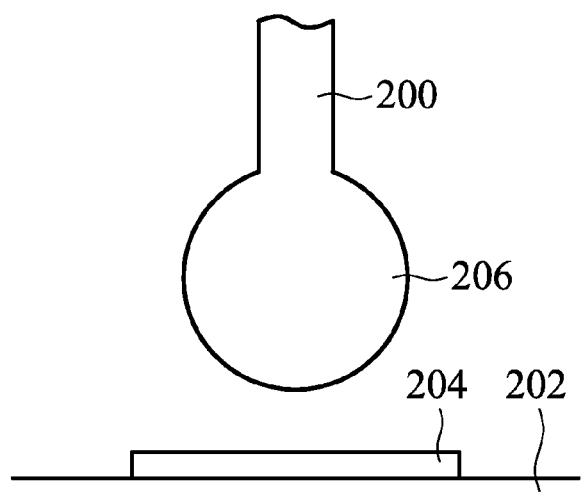

Referring to FIGS. 1 and 3, an end of the silver alloy wire 200 is melted to form a first free air ball 206 in step 104. According to the embodiment, the first free air ball 206 may be formed by an electric flame off (EFO). However, according to some embodiments, the first free air ball 206 may be formed by other methods during a wire bonding process.

Figure 4:
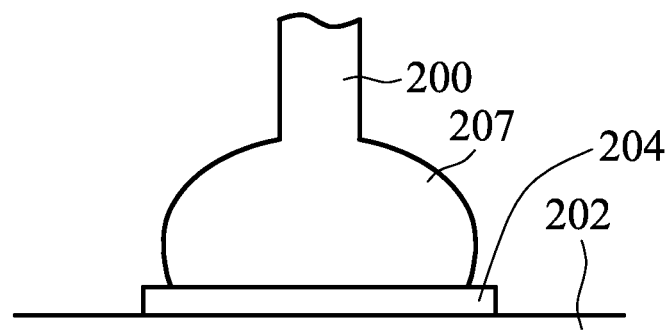

Referring to FIGS. 1 and 4, the first free air ball 206 is bonded onto the bonding pad 204 of the substrate 202 to form a first ball bond 207 in step 106. According to the embodiment, the first free air ball 206 is bonded onto the substrate 202 by hot pressing or ultrasonic hot pressing. However, according to some embodiments, the first free air ball 206 may be bonded to the substrate 202 to form the first ball bond 207 by other methods during a wire bonding process.

Figure 5:
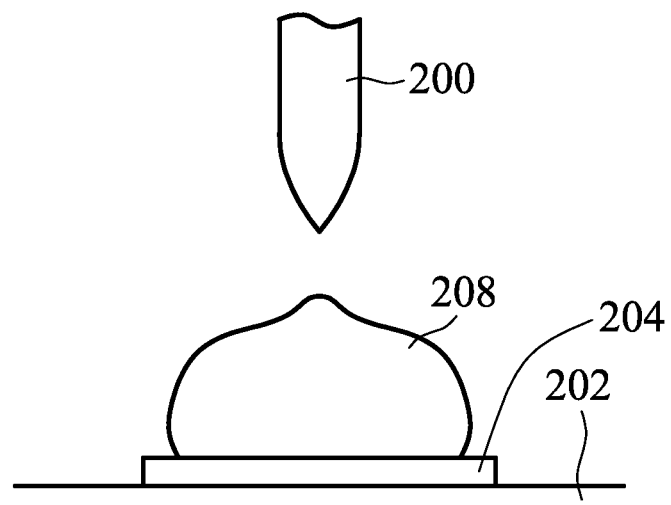

Referring to FIGS. 1 and 5, the silver alloy wire 200 is cut off, such that the first ball bond 207 is left on the bonding pad 204 of the substrate 202 to form a first silver alloy stud bump 208 in step 108. According to the embodiment, the stud bump structure may comprise: a substrate 202, and a first silver alloy stud bump 208 disposed on the bonding pad 204 on the substrate 202. A diameter of the first silver alloy stud bump 208 may be between 20 μm and 100 μm.

According to one embodiment, the first silver alloy stud bump 208 has a weight percentage ratio of Ag:Au:Pd=60-99.98:0.01-30:0.01-10, wherein silver is the main element in the first silver alloy stud bump 208 (for example, containing more than 50 wt % of silver). According to the experiments, it was discovered that if a stud bump is formed of pure silver (Ag), the silver stud bump will be too soft and easily oxidize. However, if an appropriate amount of gold (Au) is added into the stud bump, the bonding strength of the stud bump and the oxidation resistance will be improved. In addition, if an appropriate amount of palladium (Pd) is added into the stud bump, it can not only improve the strength and oxidation resistance of the stud bump, but also suppress excessive formation of intermetallic compounds and electromigration of silver. On the other hand, if too much gold is added into the stud bump, the interface between stud bump and aluminum pad may contain too thick intermetallic compounds, resulting in embrittlement of the connection point and an increase of costs. In addition, when too much palladium is added into the stud bump, the stud bump may become too rigid and too brittle, limiting its applications.

It is noted that although the stud bump structure described above comprises specific compositions of silver, gold, and palladium, the scope of the disclosure is not to be limiting. According to some embodiments, the stud bump structure may also comprise other metal elements, non-metal elements, or some contaminants. However, these additional elements should be used depending on various applications, and the performance of the stud bump structure should remain the same.

Compared to stud bumps formed of other metals (such as a gold stud bump or a copper stud bump), the silver alloy stud bump according to various embodiments can be more widely applied to various applications and have a better stability. For example, if gold (Au) stud bump is used, a great amount of gold in the gold stud bump may be dissolved into melting solder to form an intermetallic compound, $AuSn_4$, when the stud bumping chip is assembled to a substrate by soldering process. Furthermore, when the device is operated or when the reliability test is performed, a great amount of brittle intermetallic compounds, $Au_xAl_y$, and Kirkendall voids may be formed at the interface between gold stud bump and aluminum pad, resulting in a breakage of the connection points, an increase of electrical resistively, and a decrease of the reliability of the electronic products. Therefore, generally, the gold stud bump is assembled by a polymer conductive adhesive. However, the electrical and thermal conductivities of polymer conductive adhesive is much worse than metallic solder bonding.

On the contrary, if a copper stud bump is used, there may be insufficient intermetallic compounds formed at the interface between copper stud bump and aluminum pad, and therefore it will be difficult to know whether or not it is connected successfully. In addition, resulting products tend to fail when a metal residue test is required. Furthermore, copper is prone to oxidize and corrode, and the reliability of resulting electric devices is usually poor. Moreover, since rigidity of copper is high, the under-pad chip may be broken during the copper stud bumping process. Therefore, it is difficult to use a copper stud bump in the process described above.

On the other hand, the silver alloy stud bump according to various embodiments is softer, and therefore, a chip may not be damaged when bonding the free air ball thereon. There may not be so much brittle intermetallic compounds as the gold stud bump formed during the bonding process. In contrast to the copper stud bump, there may still be enough amount of the intermetallic compounds formed, leading to a satisfactory bonding. In addition, the resulting products can pass the metal residue test. According to various embodiments, the silver alloy stud bump may be bonded by soldering, conductive adhesive, or hot pressing, but other bonding methods may also be used depending on applications.

In addition, the silver alloy stud bump may be formed on a chip or may be directly formed on a wafer to perform a wafer level package. An advantage of forming the silver alloy stud bumps on a wafer directly includes the processing cost being reduced by forming a great amount of the silver alloy stud bumps before cutting the wafer. In a wafer level packaging process, more than ten thousands of stud bumps may be formed on a single wafer before dicing. In other words, the wafer is continuously heated during the hot pressing process to form the stud bumps. Therefore, when the last stud bump is finally formed on the wafer, the first stud bump formed at the beginning of the process may be heated with the wafer for a long time. As a result, the early bonded gold stud bumps have a concern that a great amount of intermetallic compounds may grow after the finish of wafer level packaging process. In this case, the gold stud bump formed at the initial stage of the process may be damaged due to the embrittlement of the connection point and the bonding strength (ie. adhesive force) of the connection points being weakened. Therefore, the gold stud bump has encountered severe problems for the application in wafer level packaging. In contrast, copper stud bumps may result in insufficient intermetallic compounds at the bump/pad interface and are not suitable for a wafer level package, either. In addition, copper is so rigid that the wafer may be damaged during the bonding process. More severely, copper tends to be oxidized at high temperatures, especially for those stud bumps formed at the beginning of the process and have been heated with the wafer for a long time during the wafer level packaging.

On the other hand, for the silver alloy stud bumps, the intermetallic compounds may be grown slowly to an appropriate thickness and the connection can be confirmed by the appearance of the intermetallic compound. In addition, when the silver alloy stud bumps are formed directly on a wafer during wafer level packaging, even if the silver alloy stud bumps formed at the initial stage of the process have been heated with the wafer for a long time, there will not be a great amount of intermetallic compounds formed resulting from heating. Therefore, the bonding strength of the silver alloy stud bumps can be maintained. It is obvious that the silver alloy stud bump in this invention is superior to the gold stud bump and copper stud bump for the application in wafer level package.

Figure 6:
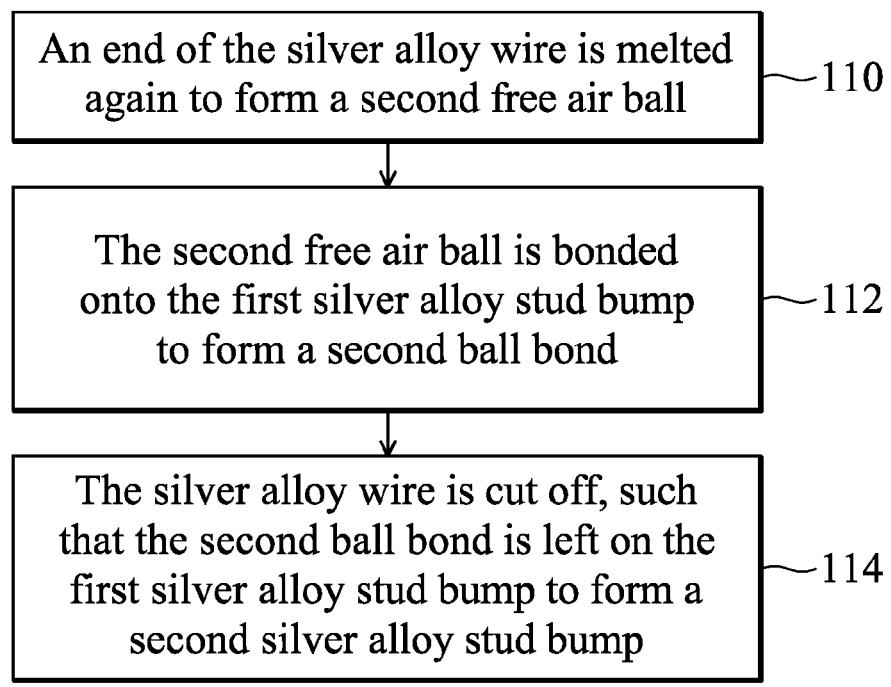
FIG. 6 illustrates a method for manufacturing a stud bump stacking structure according to one embodiment.
Figure 7:
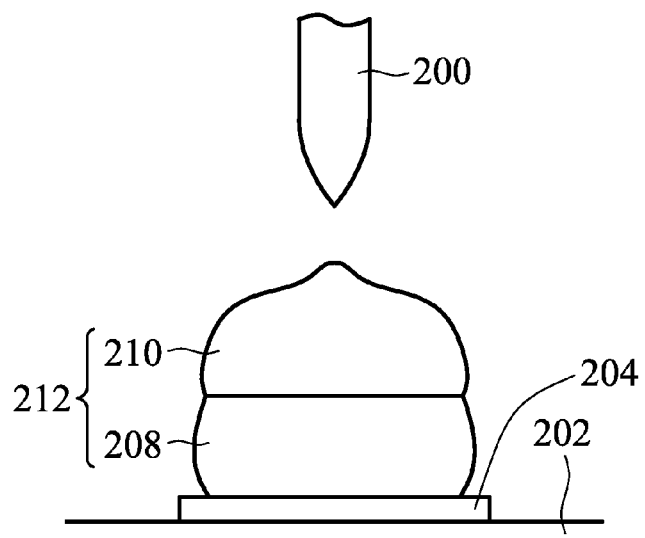
FIG. 7 illustrates the stud bump stacking structure formed by the method shown in FIG. 6.
Figure 8:
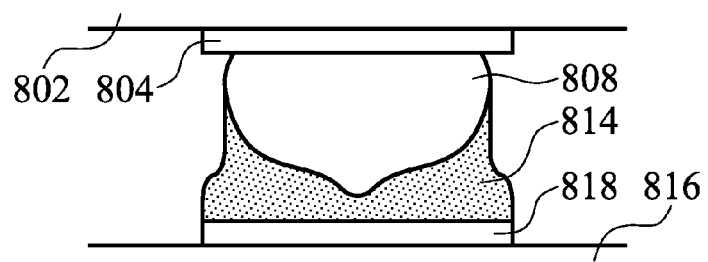
FIGS. 8 to 12 illustrate applications of the silver stud bump structure in a flip chip packaging according to some embodiments.

FIG. 6 illustrates a method for manufacturing a stud bump stacking structure according to one embodiment. FIG. 7 illustrates the stud bump stacking structure formed by the method shown in FIG. 6. Referring to FIG. 6, after the step 108 in FIG. 1, steps 110, 112, and 114 may also be performed. In step 110, an end of the silver alloy wire 200 is melted again to form a second free air ball. In step 112, the second free air ball is bonded onto the first silver alloy stud bump 208 to form a second ball bond. In step 114, the silver alloy wire 200 is cut off, such that the second ball bond is left on the first silver alloy stud bump 208 to form a second silver alloy stud bump 210, as shown in FIG. 7.

Referring to FIG. 7, the stud bump structure comprises: a substrate 202; a first silver alloy stud bump 208 disposed on a bonding pad 204 on the substrate 202; and a second silver alloy stud bump 210 disposed on the first silver alloy stud bump 208. According to the embodiment, the second silver alloy stud bump 210 and the first silver alloy stud bump 208 have the same composition, wherein the weight percentage ratio is Ag:Au:Pd=60-99.98:0.01-30:0.01-10, and silver is the main element in the second silver alloy stud bump and the first silver alloy stud bump (for example, more than 50 wt % of silver). It is noted that although the stud bump structure described above comprise a specific composition of silver, gold, and palladium, the scope of the disclosure is not to be limiting. According to other embodiments, the stud bump structure may also comprise other metal elements, non-metal elements, or some contaminants. However, these additional elements should be used depending on various applications, and the performance of the stud bump structure should not be damaged. According to another embodiment, the second silver alloy stud bump may have a different composition with the first silver alloy stud bump.

The stud bump stacking structure 212 formed by the first silver alloy stud bump 208 and the second silver alloy stud bump 210 has a height greater than an original one, and therefore the electric devices assembles by the stud bump stacking structure may have a higher tolerance for deformation, leading to better reliability. In addition, since the first silver alloy stud bump 208 and the second silver alloy stud bump 210 may be formed by the same silver alloy wire 200, the structure may be formed in a single manufacturing machine. Therefore, the process may be simplified and the cost may be decreased.

FIGS. 8 to 12 illustrate applications of the silver stud bump structure in a flip chip packaging according to some embodiments. For clarity, units similar or the same with the units described above will not be repeatedly described in detail. According to one embodiment shown in FIG. 8, a first silver alloy stud bump 808 on a bonding pad 804 on a first chip 802 is flipped and disposed on a bonding pad 818 on a substrate 816. Then, the first silver alloy stud bump 808 is bonded onto the substrate 816 by an adhesive 814 to form a first flip chip package. In this embodiment, the first silver alloy stud bump 808 has the weight percentage ratio of Ag:Au:Pd=60-99.98:0.01-30:0.01-10, wherein silver is the main element in the second silver alloy stud bump and the first silver alloy stud bump (for example, containing more than 50 wt % of silver). Examples of the bonding pad 804 and the bonding pad 818 may include, but are not limited to, an Al pad, a Ni pad, a Cu pad, an Au pad, or other appropriate surface finished pads. The adhesive 814 may be conductive adhesive or solder, for example. The substrate 816 may be a printed circuit board, another chip or a wafer.

Figure 9:
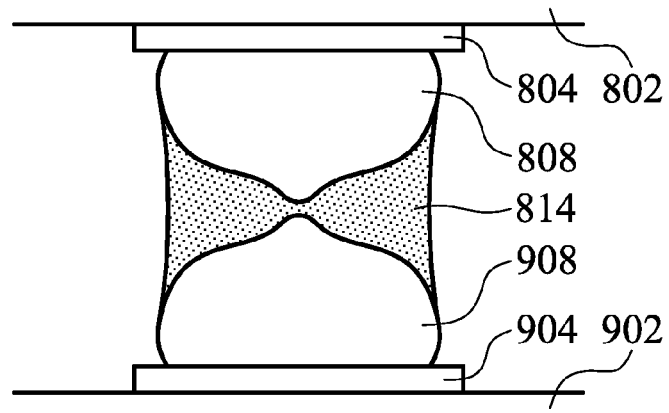

According to one embodiment shown in FIG. 9, a silver alloy stud bump 908 is formed on a bonding pad 904 on a second chip 902. Then, the first silver alloy stud bump 808 on the first chip 802 and the silver alloy stud bump 908 are bonded by adhesive 814 to form a second flip chip package.

Figure 10:
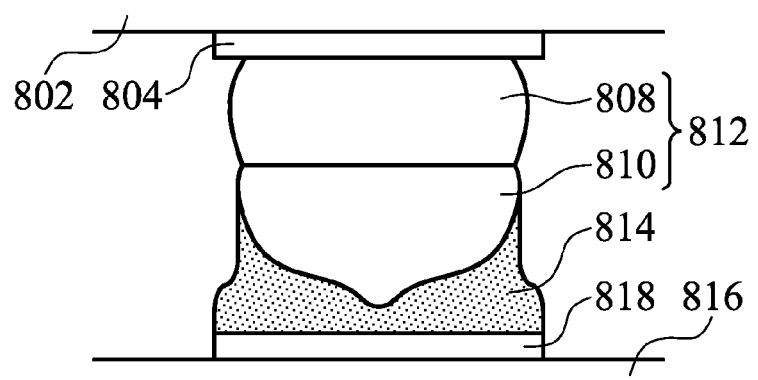

According to one embodiment shown in FIG. 10, a stud bump stacking structure 812 containing the first silver alloy stud bump 808 and the second silver alloy stud bump 810 is formed on the bonding pad 804 on the first chip 802. Then, the first chip 802 is flipped, and the stud bump stacking structure 812 is bonded onto the bonding pad 818 on the substrate 816 by adhesive 814 to form a third flip chip package.

Figure 11:
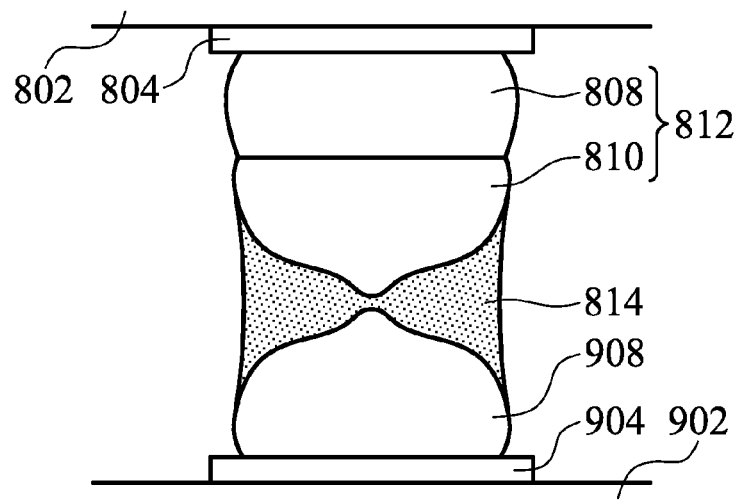

According to one embodiment shown in FIG. 11, a silver alloy stud bump 908 is formed on a bonding pad 904 on a second chip 902. Then, the first chip 802 (with a stud bump stacking structure 812 containing the first silver alloy stud bump 808 and the second silver alloy stud bump 810 formed thereon) is flipped and disposed on the second chip 902. Then, the stud bump stacking structure 812 on the first chip 802 and the silver alloy stud bump 908 on the second chip 902 are bonded by an adhesive 814 to form a forth flip chip package.

Figure 12:
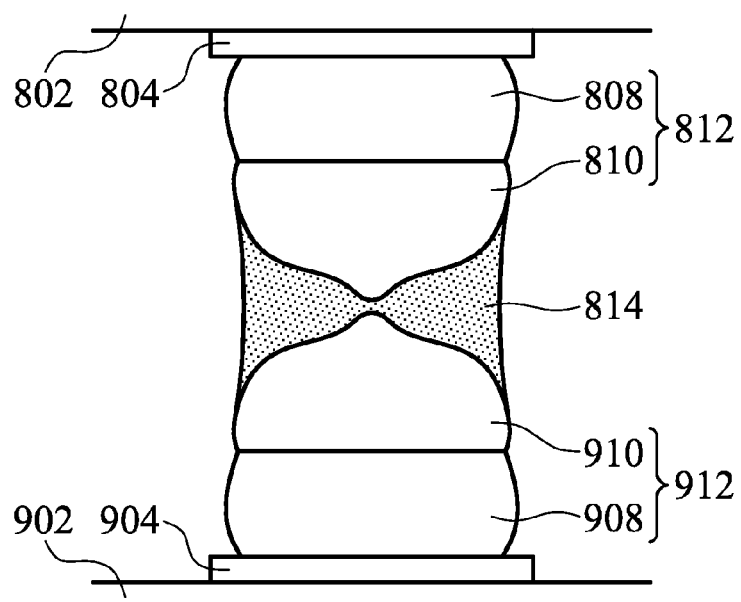

According to one embodiment shown in FIG. 12, a stud bump stacking structure 912 containing the first silver alloy stud bump 908 and the second silver alloy stud bump 910 is formed on the bonding pad 904 on the second chip 902. Then, the first chip 802 (with a stud bump stacking structure 812 containing the first silver alloy stud bump 808 and the second silver alloy stud bump 810 formed thereon) is flipped and disposed on the second chip 902. Then, the stud bump stacking structure 812 and the stud bump stacking structure 912 are bonded by an adhesive 814 to form a fifth flip chip package.

Figure 13:
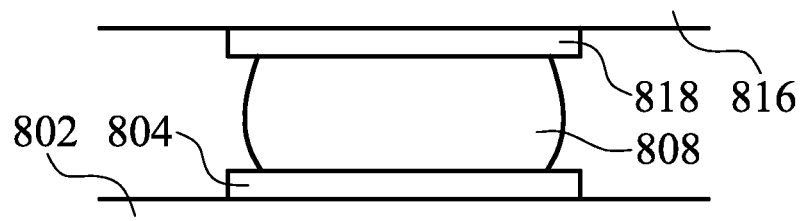
FIG. 13 illustrates a silver alloy stud bump applied to a tape automated bonding process according to one embodiment.

FIG. 13 illustrates a silver alloy stud bump applied to a tape automated bonding process according to one embodiment. Referring to FIG. 13, a bonding pad 818 on the flexible polymer substrate 816 is bonded to the first silver alloy stud bump 808 on the bonding pad 804 on the chip 802 by tape automated bonding. The first silver alloy stud bump 808 is bonded to the bonding pad 818 on the flexible polymer substrate 816 of the tape automated bonding package by hot pressing.

According to various embodiments described above, a novel silver alloy stud bump and a method for manufacturing the same are provided. The silver alloy stud bump may form a sufficient amount of intermetallic compounds with an aluminum pad, such that a satisfactory bonding interface may be resulted in. On the other hand, since the intermetallic compound of the silver alloy stud bump grows very slowly, the interface of the connection points will not become brittle, and the reliability of the silver alloy stud bump may be improved. In addition, compared to solder bumps, the silver alloy stud bump is better for the environment (resulting in less pollution) and the composition of the silver alloy may be controlled more precisely. Moreover, the difficulty of coplanarity may not occur. Further, the silver alloy stud bump may be used in a wafer level packaging process.

Comparative Example 1

One end of a pure gold wire (diameter: 25.4 μm) was melted by electric flame off (EFO) to form a free air ball due to surface tension. The free air ball was bonded to an aluminum pad on a silicon chip to form a ball bond by ultrasonic hot pressing. Then, the gold wire was cut off to form a gold stud bump. The manufacturing details are shown in Table 1. The size of the resulting gold stud bumps are shown in Table 2. The adhesion force of the resulting gold stud bumps are shown in Table 3.

Comparative Example 2

One end of a pure copper wire (diameter: 25.4 μm) was melted by electric flame off (EFO) to form a free air ball due to surface tension. The free air ball was bonded to an aluminum pad on a silicon chip to form a ball bond by ultrasonic hot pressing under forming gas (95% $N_2$+5% $H_2$). Then, the copper wire was cut off to form a copper stud bump. The manufacturing details are shown in Table 1. The size of the resulting copper stud bumps are shown in Table 2. The adhesion force of the resulting copper stud bumps are shown in Table 3.

Example 1

Manufacturing Stud Bump

One end of a silver alloy wire (89 wt % Ag-8 wt % Au-3 wt % Pd; diameter: 25.4 μm) was melted by electric flame off (EFO) to form a free air ball due to surface tension. The free air ball was bonded to an aluminum pad on a silicon chip to form a ball bond by ultrasonic hot pressing. Then, the silver alloy wire was cut off to form a silver alloy stud bump. The manufacturing details are shown in Table 1. The size of the resulting silver alloy stud bumps are shown in Table 2. The adhesion force of the resulting silver alloy stud bumps are shown in Table 3. Referring to Table 2, the size of the silver alloy stud bump was smaller than the size of the gold stud bump and slightly larger than the size of copper stud bump although the wires used for forming the stud bumps had the same diameter. The smaller size of the silver alloy stud bump had an advantage as it may be used in a high density package with a small connection distance. A ball shear test was performed to the resulting silver alloy stud bump in Example 1 and the gold stud bump in Comparative Example 1 by a bond tester DAGE4000, and the result showed that the adhesion force of the silver alloy stud bump was 21% and 28% higher than the adhesion force of the gold stud bump and copper stud bump, respectively.

TABLE 1

The manufacturing details

|  | Silver alloy stud bump | Gold stud bump | Copper stud bump |
| --- | --- | --- | --- |
| Power | 230 (dac) | 230 (dac) | 260 (dac) |
| Time | 10 (ms) | 13.5 (ms) | 13.5 (ms) |
| Adhesion force | 24 (gf) | 24 (gf) | 30 (gf) |
| Adhesion time | 12 (ms) | 12 (ms) | 15 (ms) |
| Current | 46 (mA) | 40 (mA) | 50 (mA) |
| Discharge time | 0.46 (ms) | 0.46 (ms) | 0.46 (ms) |

TABLE 2

The size of resulting alloy stud bumps

|  | Silver alloy stud bump | | Gold stud bump | | Copper stud bump | |
| --- | --- | --- | --- | --- | --- | --- |
|  | Diameter | Thickness | Diameter | Thickness | Diameter | Thickness |
| Sample number | 30 | 30 | 30 | 30 | 30 | 30 |
| Maximum | 52.5 μm | 17.2 μm | 55.4 μm | 17.6 μm | 52.3 μm | 19.5 μm |
| Minimum | 46.6 μm | 15.4 μm | 47.0 μm | 15.8 μm | 45.8 μm | 15.2 μm |
| Average | 49.3 μm | 16.0 μm | 53.4 μm | 16.2 μm | 48.8 μm | 15.4 μm |

TABLE 3

The adhesion force of resulting stud bumps

| | Silver alloy stud bump | Gold stud bump | Copper stud bump |
|---|---|---|---|
| | Sample number | | |
| | 30 | 30 | 30 |
| Maximum | 32.22 g | 26.35 g | 28.3 g |
| Minimum | 27.12 g | 21.08 g | 20.1 g |
| Average | 29.42 g | 24.32 g | 23.0 g |

Example 2

Reliability Test

The silver alloy stud bump in Example 1, gold stud bump in Comparative Example 1, and copper stud bump in Comparative Example 2 manufactured on silicon chips were respectively bonded to a chip and then underfilled and flip-chip assembled to a bismaleimide triazine resin (BT resin) substrate of a ball grid array package (BGA) by soldering process (solder composition: 96.5 wt % Pb-3 wt % Ag-0.5 wt % Cu). Then, the free air ball was disposed on the back side of the BT substrate to finish the assembly of a flip chip/BGA high density packaging product. After that, a temperature cycling test (TCT), a pressure cooking test (PCT), a high temperature storage (HTS) test were performed to each of the resulting stud bump packaging products to test their reliability.

According to the experiments, the intermetallic compound formed between the interface between the gold stud bump and the aluminum pad on the chip had a thickness of 2.1 µm. The intermetallic compound was so thick that the connection points of the product became brittle and broken, resulting in a failure of the product. On the other hand, the intermetallic compound formed between the interface of the copper stud bump and the aluminum pad had a thickness of 0.2 µm. The amount of the intermetallic compound was too little to know whether the connection was successful or not. However, the intermetallic compound formed at the interface between the silver alloy stud bump and the aluminum pad had a thickness of 0.6 µm. The intermetallic compound was thick enough to know whether the connection was completed, but it was not too thick to make it break easily.

In addition, 500 times of the temperature cycling test were performed to the gold stud bump in Comparative Example 1, and the thickness of the intermetallic compound of the gold stud bump increased to 3.8 µm. 3000 times of the temperature cycling test were performed to the copper stud bump in Comparative Example 2, and the thickness of the intermetallic compound of the copper stud bump was only 0.3 µm. 3000 times of the temperature cycling test were performed to the silver alloy stud bump in Example 1, and the thickness of the intermetallic compound of the silver alloy stud bump increased to 1.0 µm.

Furthermore, after 168 hours of the pressure cooking test, the thickness of the intermetallic compound of the gold stud bump in Comparative Example 1 increased to 3.1 µm, the thickness of the intermetallic compound of the copper stud bump in Comparative Example 2 was only 0.4 µm, and the thickness of the intermetallic compound of the silver alloy stud bump in Example 1 increased to 0.9 µm.

Furthermore, after 500 hours of the high temperature storage test, the thickness of the intermetallic compound of the gold stud bump in Comparative Example 1 increased to 4.3 µm, such that the aluminum pad on the chip was almost consumed completely, the thickness of the intermetallic compound of the copper stud bump in Comparative Example 2 was only 0.7 µm, and the thickness of the intermetallic compound of the silver alloy stud bump in Example 1 increased to 1.8 µm.

Accordingly, the intermetallic compound of the gold stud bump in Comparative Example 1 grew so fast that the connection points became brittle. On the contrary, there was not enough of an intermetallic compound grown to know whether the connection was completed or not for the copper stud bump in Comparative Example 2. However, the intermetallic compound of the silver alloy stud bump in Example 1 had the thickness between the thickness of the intermetallic compound of the gold stud bump and the copper stud bump. In other words, the interface of the silver alloy stud bump did not become brittle and the connection was completed. Therefore, the silver alloy stud bump in Example 1 had a better reliability than the stud bumps in Comparative Examples 1 and 2.

Example 3

Wafer Level Package 12,000 of the silver alloy stud bumps in Example 1, gold stud bumps in Comparative Example 1, and copper stud bumps in Comparative Example 2 were formed on a silicon wafer (6 inches), respectively, to test for a wafer level package.

After all the stud bumps were formed on the wafer, the thickness of the intermetallic compound formed thereon was analyzed. According to the experiments, the intermetallic compound formed in the first ten gold stud bumps (ie. the first stud bump to the tenth stud bump formed at the beginning of the process) had an average thickness of 3.2 µm, the intermetallic compound formed in the first ten copper stud bumps had an average thickness of 0.4 µm, and the intermetallic compound formed in the first ten silver alloy stud bumps had an average thickness of 0.8 µm. The gold stud bumps formed at the beginning of the process became brittle and broke after all the stud bumps were formed. The copper stud bumps were poorly connected and were seriously oxidized, and the chip almost broke. However, the silver alloy stud bump did not have the problems described above.

Furthermore, the yields of the gold stud bumps in Comparative Example 1 and the silver alloy stud bump in Example 1 were almost 100%. However, the yield of the copper stud bumps in Comparative Example 2 was about 64%.

In addition, an average adhesion force of the first ten gold stud bumps (ie. the first ten stud bumps formed at the initial stage of the process) was 17% lower than an average adhesion force of the last ten gold stud bumps. An average adhesion force of the first ten copper stud bumps was 37% lower than an average adhesion force of the last ten copper stud bumps. An average adhesion force of the first ten silver stud bumps was almost the same with an average adhesion force of the last ten silver alloy stud bumps.

Example 4

Tape Automated Bonding

The silver alloy stud bump in Example 1, the gold stud bump in Comparative Example 1, and copper stud bumps in Comparative Example 2 were formed on an aluminum pad on an integral circuit chip respectively. A hot pressing head was used to bond the stud bump and a copper electrode on a polyimide (PI) substrate. Then, a ball shear test was performed to the silver alloy stud bump and the gold stud bump on the chip by a bond tester DAGE4000. The results are shown in Table 4. As shown in Table 4, the adhesion force of the silver alloy stud bump was 17% and 18% higher than the adhesion force of the gold stud bump and copper stud bump, respectively.

TABLE 4

Results of the shear test performed to the silver alloy stud bump and the gold stud bump

| Sample number | Silver alloy stud bump | Au stud bump | Copper stud bump |
|---|---|---|---|
| | 30 | 30 | 30 |
| Maximum value | 63.2 g | 54.6 g | 58.3 g |
| Minimum value | 58.9 g | 50.4 g | 49.7 g |
| Average value | 61.2 g | 52.5 g | 51.9 g |

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A stud bump structure, comprising
   a first substrate; and
   a first silver alloy stud bump disposed on the first substrate and assembled to a second substrate, wherein the first silver alloy stud bump is composed of Ag, Au, and Pd and has a weight percentage ratio of Ag:Au:Pd=89.99-97.99:0.01:2-10,
   wherein the first substrate comprises a wafer and the second substrate comprises a wafer or a printed circuit board.

2. The stud bump structure as claimed in claim 1, further comprising a bonding pad on the first substrate, wherein the first silver alloy stud bump is disposed on the bonding pad.

3. The stud bump structure as claimed in claim 1, further comprising a second silver alloy stud bump disposed on the first silver alloy stud bump.

4. The stud bump structure as claimed in claim 3, wherein a diameter and a height of the second silver alloy stud bump is between 20 μm and 100 μm.

5. The stud bump structure as claimed in claim 3, wherein the second silver alloy stud bump and the first silver alloy stud bump have the same composition.

6. The stud bump structure as claimed in claim 1, wherein a diameter and a height of the first silver alloy stud bump is between 20 μm and 100 μm.

7. A method for manufacturing a stud bump structure as claimed in claim 1, comprising
   providing a silver alloy wire;
   melting an end of the silver alloy wire to form a first free air ball;
   bonding the first free air ball onto a first substrate to form a first ball bond;
   cutting off the silver alloy wire, such that the first ball bond is left on the first substrate to form a first silver alloy stud bump, wherein the first silver alloy stud bump is composed of Ag, Au, and Pd and has a weight percentage ratio of Ag:Au:Pd=89.99-97.99:0.01:2-10; and
   assembling the first silver alloy stud bump to a second substrate,
   wherein the first substrate comprises a wafer and the second substrate comprises a wafer or a printed circuit board.

8. The method for manufacturing a stud bump structure as claimed in claim 7, wherein a wire diameter of the silver alloy wire is between 10 μm and 50 μm.

9. The method for manufacturing a stud bump structure as claimed in claim 7, wherein the first free air ball is bonded onto the first substrate to form a first ball bond by hot pressing or ultrasonic hot pressing.

10. The method for manufacturing a stud bump structure as claimed in claim 7, further comprising a bonding pad on the first substrate, wherein the first free air ball is disposed on the bonding pad.

11. The method for manufacturing a stud bump structure as claimed in claim 7, further comprising
    melting an end of the silver alloy wire again to form a second free air ball;
    bonding the second free air ball onto the first silver alloy stud bump to form a second ball bond; and
    cutting off the silver alloy wire, such that the second ball bond is left on the first silver alloy stud bump to form a second silver alloy stud bump.

12. The method for manufacturing a stud bump structure as claimed in claim 11, wherein a diameter and a height of the second silver alloy stud bump is between 20 μm and 100 μm.

13. The method for manufacturing a stud bump structure as claimed in claim 7, wherein a diameter and a height of the first silver alloy stud bump is between 20 μm and 100 μm.

* * * * *